United States Patent

Ueda et al.

[11] Patent Number: 5,711,646
[45] Date of Patent: Jan. 27, 1998

[54] SUBSTRATE TRANSFER APPARATUS

[75] Inventors: Issei Ueda; Masami Akimoto, both of Kumamoto; Hiroyuki Kudou, Kumamoto-ken, all of Japan

[73] Assignees: Tokyo Electron Limited, Tokyo; Tokyo Electron Kyushu Limited, Tosu, both of Japan

[21] Appl. No.: 837,520

[22] Filed: Apr. 22, 1997

Related U.S. Application Data

[63] Continuation of Ser. No. 538,644, Oct. 4, 1995, abandoned.

[30] Foreign Application Priority Data

Oct. 7, 1994 [JP] Japan ................ 6-268054

[51] Int. Cl.$^6$ ........................... B25J 15/06
[52] U.S. Cl. ................ 414/225; 414/744.3; 414/937; 414/941; 294/64.1
[58] Field of Search ............... 414/935, 937, 414/941, 416, 222, 225, 331, 744.2, 744.3, 744.4, 749; 294/1.1, 32, 64.1, 87.1

[56] References Cited

U.S. PATENT DOCUMENTS

| | | | |
|---|---|---|---|
| 4,775,281 | 10/1988 | Prentakis | 414/331 X |
| 5,007,784 | 4/1991 | Genov et al. | 414/937 X |
| 5,123,804 | 6/1992 | Ishii et al. | 414/222 X |

FOREIGN PATENT DOCUMENTS 6-87531  3/1994  Japan.

Primary Examiner—Donald W. Underwood
Attorney, Agent, or Firm—Oblon, Spivak, McClelland, Maier & Neustadt, P.C.

[57] ABSTRACT

A substrate transfer apparatus for receiving and delivering a substrate among a plurality of process locations and transferring the substrate among the process locations comprises an apparatus body, a transfer member, movably provided on the apparatus body, for supporting and transferring the substrate, the transfer member having a plurality of support portions for supporting the substrate at different positions in the same plane, moving mechanism for moving the transfer member for enabling the transfer member to receive and deliver the substrate, and switching mechanism for switching the position of the transfer member among a plurality of positions for receiving and delivering the substrate on the support portions.

20 Claims, 7 Drawing Sheets

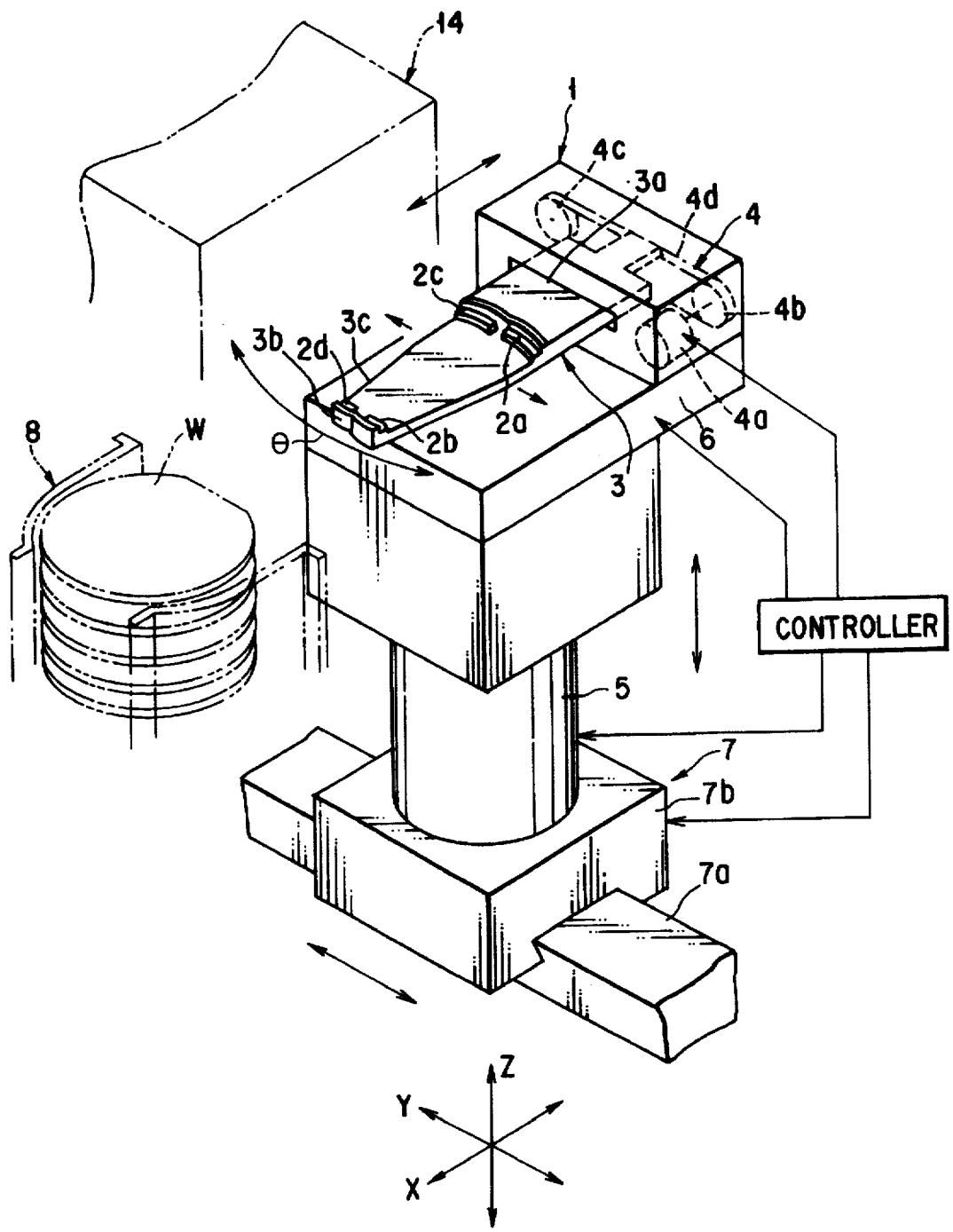
F I G. 1

5,711,646

SUBSTRATE TRANSFER APPARATUS

This application is a Continuation of application Ser. No. 08/538,644, filed on Oct. 4, 1995, now abandoned.

BACKGROUND OF THE INVENTION

1. Field of the Invention

The present invention relates to a substrate transfer apparatus comprising a transfer member for transferring substrates to be processed among a plurality of process units.

2. Description of the Related Art

A process of manufacturing a semiconductor device includes a photolithography step in which a circuit pattern is reduced in size and transferred onto a photoresist on the surface of a semiconductor wafer or a substrate to be processed and the circuit pattern is developed by using a photolithography technique. Each of process units used in the lithography step is provided with a transfer apparatus comprising a transfer member, such as clamp or an arm, for transferring semiconductor wafers into or out of the process unit.

For example, the transfer apparatus used in the lithography step takes out a non-processed wafer from a carrier by means of a transfer member, transfers the non-processed wafer to a washing apparatus, receives the washed wafer by means of the transfer member, and transfers the washed wafer to the next process unit.

In the transfer member, if the portion supporting the non-washed wafer is the same as the portion supporting the washed wafer, a foreign matter on the bottom surface of the non-washed wafer adheres to the transfer member during transfer and re-adheres to the bottom surface of the washed wafer at the time of transferring the washed wafer.

A technique for solving this problem is proposed in Jpn. Pat. Appln KOKAI Publication No. 6-87531. This document discloses (1) a technique in which concentrically arranged arcuated support surfaces with stepwise structure are provided and different support surfaces are used for associated wafer passages, (2) a technique in which an additional movable unit such as a radially movable portion or a rotatable contact portion is used, and different surfaces are used for associated wafer passages, like technique (1), and (3) different transfer members are used for associated wafer passages.

However, in the technique (1) in which the concentrically arranged arcuated support surfaces with stepwise structure are provided, the wafer is supported in its inclined position. The dimension in the height direction of the transfer member increases. Consequently, the space for transferring the wafer to be contained in the carrier increases and this space cannot be used effectively. Furthermore, since the wafer is supported in its inclined position, the wafer must be, at first, situated horizontal at the time of alignment. Thus, the alignment is time-consuming, and vibration may occur in the wafer and an edge portion of the wafer may be damaged.

In the technique (2) in which the radially movable portion or rotatable contact portion is used, a mechanism for driving the movable portion is needed. Thus, the structure of the apparatus becomes complex and particles may occur due to the movement of the movable portion and adhere to the wafer.

In the technique (3) in which a plurality of transfer members are used, the size of the apparatus increases and the space for the apparatus cannot effectively be used.

SUMMARY OF THE INVENTION

The object of the present invention is to provide a substrate transfer apparatus with a simple structure capable of selectively using different support positions, at which substrates to be processed are supported in the same plane, in accordance with a plurality of transfer passages of the substrate without using an additional moving member.

According to an aspect of the invention, there is provided a substrate transfer apparatus for receiving and delivering a substrate among a plurality of process locations and transferring the substrate among the process locations, the apparatus comprising:

an apparatus body;

a transfer member, movably provided on the apparatus body, for supporting and transferring the substrate, the transfer member having a plurality of support portions for supporting the substrate at different positions in the same plane;

moving means for moving the transfer member for enabling the transfer member to receive and deliver the substrate; and switching means for switching the position of the transfer member among a plurality of positions for receiving and delivering the substrate on the support portions.

According to another aspect of the invention, there is provided a substrate transfer apparatus for receiving and delivering a substrate among a plurality of process locations and transferring the substrate among the process locations, the apparatus comprising:

an apparatus body;

a transfer member, movably provided on the apparatus body, for supporting and transferring the substrate, the transfer member having a plurality of support portions for supporting the substrate at different positions in the same plane;

moving means for moving the transfer member for enabling the transfer member to receive and deliver the substrate;

suction hold means for sucking and holding the substrate on the plurality of support portions of the transfer member; and switching means for switching the position of the transfer member among a plurality of positions for receiving and delivering the substrate on the support portions.

According to still another aspect of the invention, there is provided a substrate transfer apparatus for receiving and delivering a substrate among a plurality of process locations and transferring the substrate among the process locations, the apparatus comprising:

an apparatus body;

a plurality of transfer members, movably provided on the apparatus body, for supporting and transferring the substrate, each of the transfer members having a plurality of support portions for supporting the substrate at different positions in the same plane;

moving means for moving each of the transfer members for enabling each of the transfer members to receive and deliver the substrate; and switching means for switching the position of each of the plurality of transfer members among a plurality of positions for receiving and delivering the substrate on the support portions.

According to the present invention, when the substrate is received and delivered among a plurality of process locations and transferred among the process locations, the transfer member with a plurality of support portions for supporting the substrate at different positions is used. Thus, the support portions to be used can be selected in accordance with different transfer passages. For example, the support portions used in transferring a non-processed substrate are made different from those used in transferring a processed substrate. Accordingly, a foreign substance adhering to the bottom surface of the non-processed substrate can be prevented from re-adhering to the bottom surface of the processed substrate. In addition, since the plurality of support portions are provided in the same plane, the height of the horizontally supported substrate can be reduced as much as possible, and the installation space can be efficiently used. Furthermore, since there is no need to vary the attitude of the substrate, the alignment of the substrate is easy and no vibration occurs in the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a perspective view showing a substrate transfer apparatus according to a first embodiment of the present invention;

DETAILED DESCRIPTION OF THE PREFERRED EMBODIMENT

Figure 2:
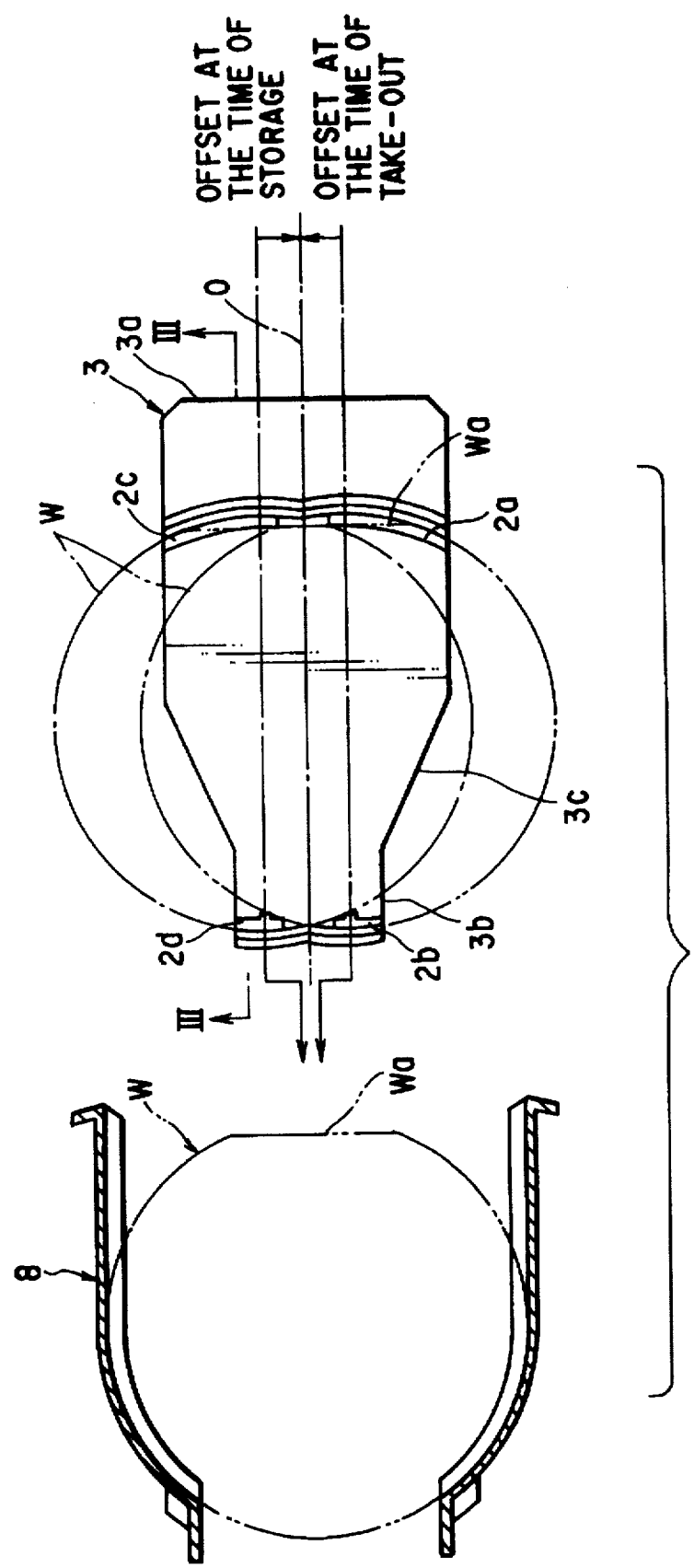
FIG. 2 is a plan view schematically showing the state in which the transfer member of the apparatus shown in FIG. 1 transfers a semiconductor wafer.

Preferred embodiments of the present invention will now be described in detail with reference to the accompanying drawings.

First Embodiment

FIG. 1 is a perspective view showing a substrate transfer apparatus 1 according to a first embodiment of the present invention.

The substrate transfer apparatus 1 comprises a transfer member or arm 3 for transferring a semiconductor wafer W; a position switching mechanism 4 for switching the position of the arm 3; a first driving unit 5 including a driving mechanism for moving the arm 3 in a vertical direction (Z-direction) and a rotating mechanism for rotating the arm 3 in a horizontal rotational direction (θ-direction); a second driving unit 6 having a driving mechanism for moving the arm 3 relative to a carrier 8 in an X-direction; and a moving mechanism 7 for moving these main components of the transfer apparatus in a Y-direction.

As is shown in FIG. 2, the arm 3 has a flat-plate shape in which a rectangular distal end portion 3b having a less lateral width than a rectangular proximal end portion 3a is provided on the distal end side of the proximal portion 3a with a tapered portion 3c interposed between the proximal end portion 3a and distal end portion 3b. For example, the arm 3 are formed of a heat-resistant, anticorrosive material such as a fluororesin or polyether ether ketone (PEEK).

Figure 3:
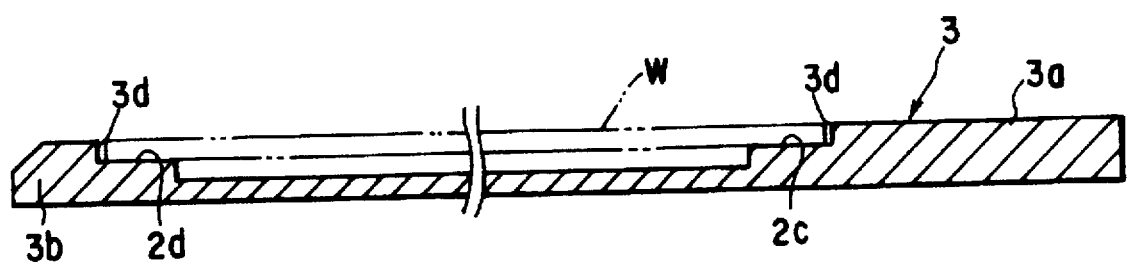
FIG. 3 is a cross-sectional view taken along line III—III in FIG. 2.

As is shown in FIGS. 2 and 3, the upper surface of the arm 3 includes first support portions 2a and 2b for supporting the semiconductor wafer in a first position, and second support portions 2c and 2d for supporting the semiconductor wafer in a second position. The support portions 2a to 2d have arcuated planar shapes. The support portions 2a and 2c are provided on the proximal end portion 3a, and the support portions 2b and 2d are provided on the distal end portion 3b. The support portions 2a and 2c, as well as support portions 2b and 2d, are provided, for example, symmetrical in the right-and-left direction with respect to a center line O which halves the proximal end portion 3a and distal end portion 3b. These support portions 2a to 2d have wafer support surfaces, and the wafer support surfaces are present within a stepped portion 3d in the same plane. Both in the case where the semiconductor wafer is supported in the first position and in the case where it is supported in the second position, the wafer is horizontally supported in the same plane.

The first support portions 2a and 2b and second support portions 2c and 2d are formed to have such positions and lengths that when the wafer W is supported by one of the pairs of first and second support portions (2a, 2b; 2c, 2d) (for example, support portions 2a, 2b), the wafer W does not come into contact with the other pair of support portions (for example, 2c, 2d). The width of each of support portions 2a, 2b, 2c and 2d in the radial direction of the wafer is set within such a range that a circuit pattern formed on the wafer W is not influenced, for example, 5 mm or less, and preferably 3 mm or less.

When an outer peripheral portion of the wafer W is provided with an alignment notch, the width and length of the support surface 2a, 2b may be relatively small since the width of the notch is small. However, in the case where the wafer W is provided with an orientation flat Wa, as shown in FIG. 2, the width and length of the support portion 2a, 2c are increased so that the region of orientation flat Wa can be supported since the size of the orientation flat Wa is greater than the width of the notch. The lateral width of the distal end portion 3b may be made equal to that of the proximal end portion 3a.

The position switching mechanism 4 comprises, for example, a forwardly/reversely rotatable stepping motor 4a and a timing belt 4d passed over a driving pulley 4b, which is driven by the stepping motor 4a, and a driven pulley 4c. The timing belt 4d is coupled to the proximal end portion 3a of the arm 3. The arm 3 are horizontally moved in its lateral direction by the driving force of the stepping motor 4a. The position of the arm 3 is switched by the position switching mechanism 4 among a plurality of positions, for example, a position for supporting the wafer W, a position for transferring the wafer W into the carrier 8.

The structure of the position switching mechanism 4 is not limited to the above-described one. For example, a ball screw mechanism may be used. Alternatively, the arm 3 may be moved by the moving mechanism 7.

Each of the first and second driving units 5 and 6 comprises, for example, a ball screw mechanism, a belt mechanism using a stepping motor, a timing belt, etc., or a linear movement mechanism (not shown) using a cylinder, etc.

The moving mechanism 7 includes a rail 7a for guiding in the Y-direction the main parts unit of the transfer apparatus which includes arm 3, position switching mechanism 4 and each driving unit, and a moving unit 7b engaged with the rail 7a and including a linear bearing and a driving unit.

The position switching mechanism 4, first and second driving units 5 and 6 and moving mechanism 7 are controlled by a controller C.

When the substrate transfer apparatus 1 having the above structure receives the wafer W from the carrier 8, the center of the position switching mechanism 4 is adjusted to the center line of the carrier 8 by means of the moving mechanism 7. Then, the position switching mechanism 4 is driven to move the arm 3 to align, in a direction perpendicular to the Y-direction, the center line of the carrier 8 with the center line of the semiconductor wafer which is, for example, supported by the first support portions 2a and 2b in the first position ("offset at the time of take-out").

Figure 4A:
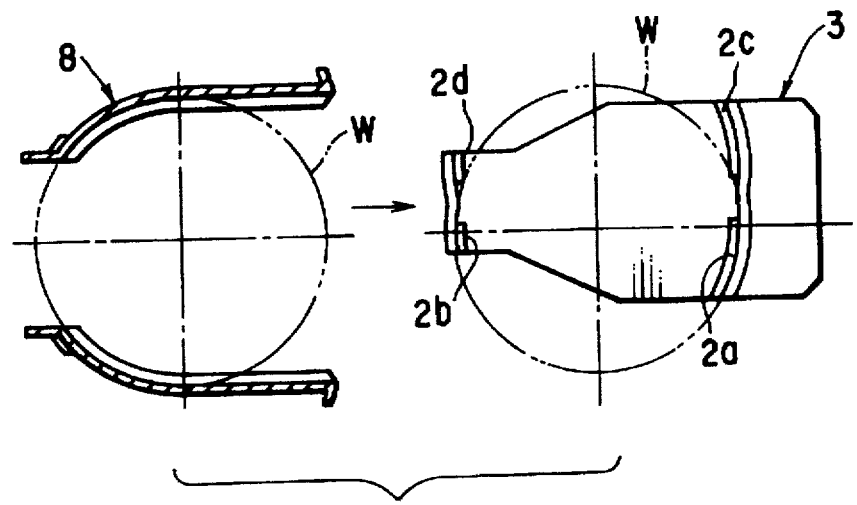
FIGS. 4A and 4B are plan views schematically illustrating the operations for receiving and delivering the semiconductor wafer in the apparatus shown in FIG. 1.

The forward/rearward driving mechanism of the second driving unit 6 is actuated to move the arm 3 in the X-direction to a location below the desired wafer W in the carrier 8. The vertical driving mechanism of the first driving unit 5 is actuated to raise the arm 3, and the wafer W is received by the arm 3. In this case, the wafer W is supported by the first support portions 2a and 2b. Then, as is shown in FIGS. 2 and 4A, the forward/rearward driving mechanism of the second driving unit 6 is retreated, and the wafer W is taken out of the carrier 8. The taken-out wafer W is transferred to the process unit, for example, a washing process unit 14.

Figure 4B:
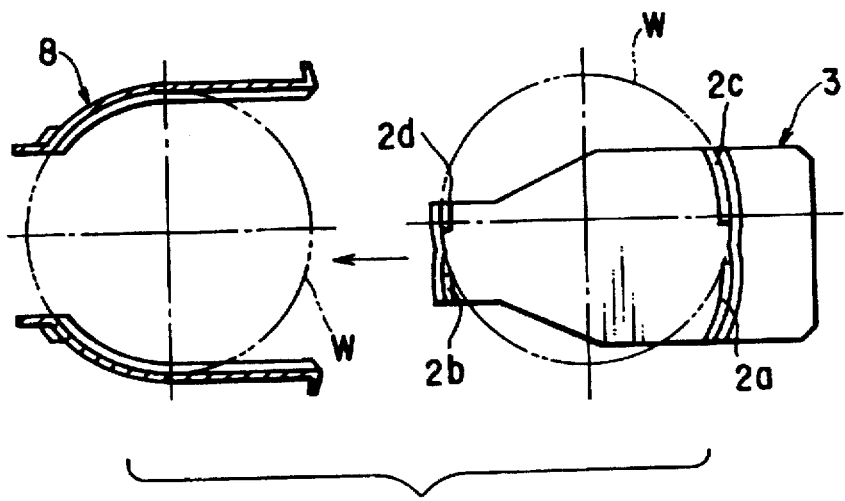

When the processed wafer W washed in the washing process unit 14 is transferred into the carrier 8, the processed wafer W is received and supported by the second support portions 2c and 2d and in this state the arm 3 are moved to a position corresponding to the carrier 8. The position switching mechanism 4 is driven to move the arm 3 to align, in a direction perpendicular to the Y-direction, the center of the carrier 8 with the center line of the semiconductor wafer W supported by the second support portions 2c and 2d ("offset at the time of storage"). Then, as shown in FIGS. 2 and 4B, the forward/rearward moving mechanism of the second driving unit 6 is driven to move the arm 3 to a desired wafer containing position within the carrier 8. Subsequently, the arm 3 are lowered by the vertical moving mechanism 5. After the wafer W is transferred into the carrier 8, the arm 3 are retreated.

As has been described above, the non-processed wafer W is received by the first support portions 2a and 2b and transferred to the process unit. The processed wafer W is received by the second support portions 2c and 2d and stored in the carrier 8. Thus, the foreign matter on the bottom surface of the nonprocessed wafer W is prevented from re-adhering to the bottom surface of the processed wafer W.

Alternatively, the non-processed wafer W may be received by the second support portions 2c and 2d and the processed wafer W may be received by the first support portions 2a and 2b.

In the above embodiment, the support surfaces of the support portions 2a to 2d are present in the same plane, and the first and second positions are set in the same plane. It is possible, however, that the support surfaces of the first support portions 2a and 2b and the support surfaces of the second support portions 2c and 2d may be provided on different levels. In this case, the re-adhering of the foreign matter to the bottom surface of the wafer W can be prevented by using different support surfaces, as described above. However, the vertical position of the arm 3 needs to be changed in accordance with the support surfaces to be used. Thus, this technique is disadvantageous with respect to the transfer control, as compared to the first embodiment.

In the above first embodiment, as shown in FIG. 2, the position switching mechanism 4 is set off on both sides of the center line O in the operations for "offset at the time of take-out" and "offset at the time of storage." However, it is possible to set the offset position for take-out as a home position and perform the take-out operation in this home position, and perform the storage operation by moving the arm 3 by a total distance of the "offset at the time of take-out" and "offset at the time of storage." Inversely, the offset position for storage may be set as a home position.

Second Embodiment

Figure 5:
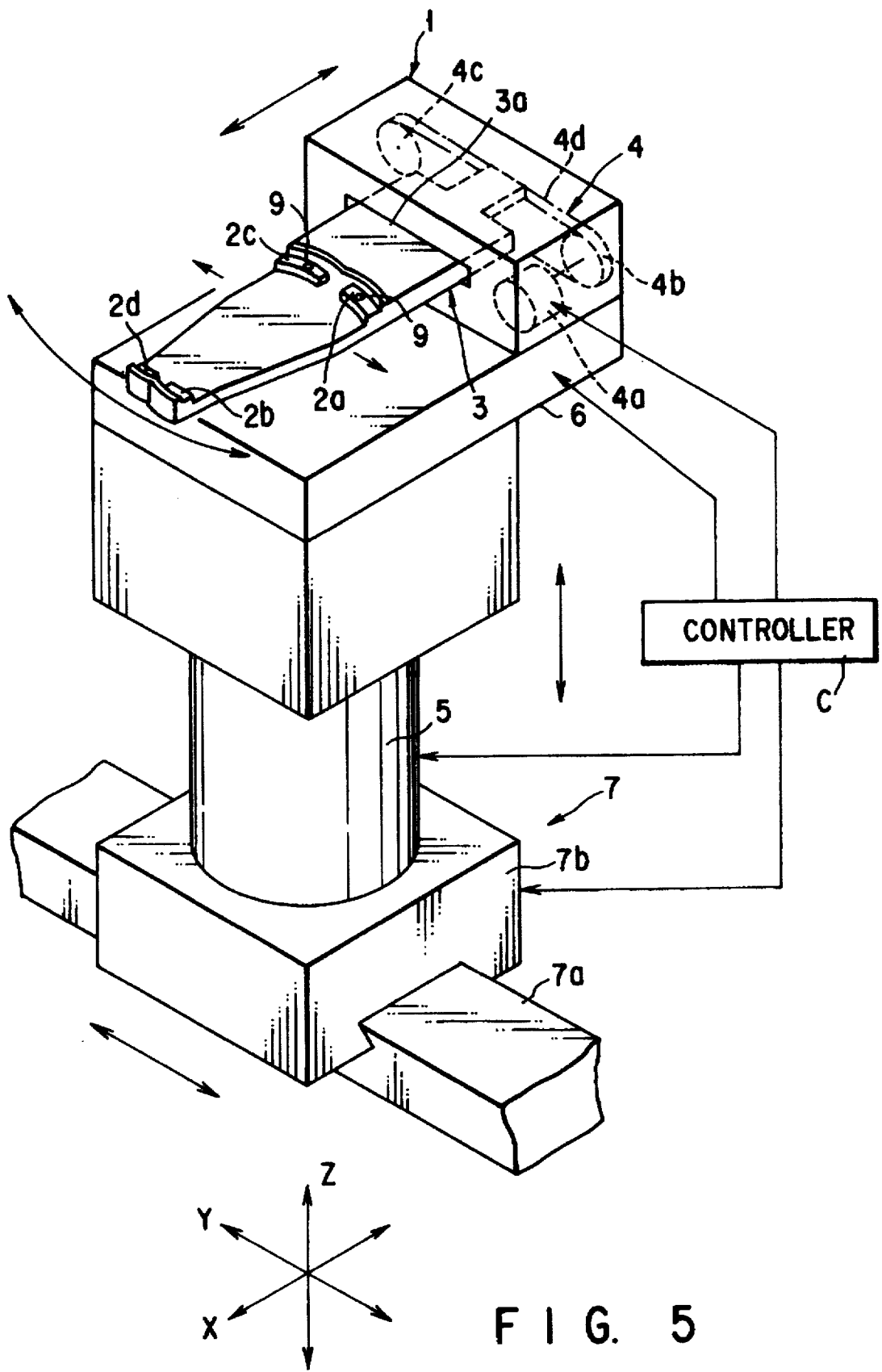
FIG. 5 is a perspective view showing a substrate transfer apparatus according to a second embodiment of the invention.

FIG. 5 is a perspective view showing a substrate conveying apparatus according to a second embodiment of the invention.

In the second embodiment, the transfer member can support the wafer W more surely. For this purpose, the support surfaces of the support portions 2a and 2c of the arm 3 are provided with suction hold small holes 9 as suction means, and the holes 9 are connected to a vacuum pump 10a via passages 10 in the arm 3. By virtue of the suction hold small holes 9 formed in the support portions 2a and 2c, the wafer W is supported and held by the first support portions 2a and 2b or second support portions 2c and 2d by the negative pressure applied from the vacuum pump 10a. Therefore, the wafer W can be surely supported.

Figure 6:
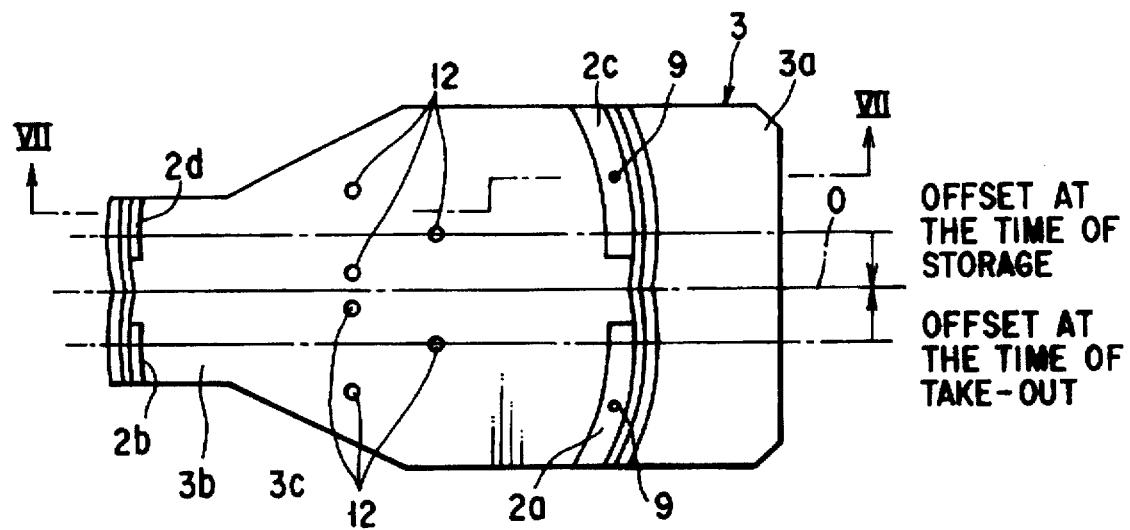
FIG. 6 is a plan view schematically showing a transfer member used in the apparatus shown in FIG. 5.
Figure 7:
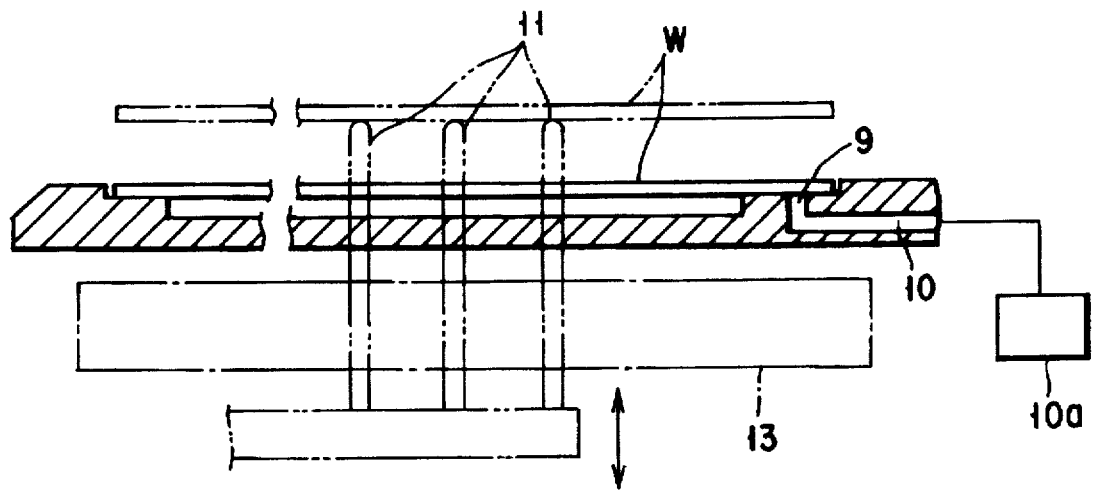
FIG. 7 is a cross-sectional view taken along line VII—VII in FIG. 6.

In this case, as shown in FIGS. 6 and 7, two groups of three through-holes 12 (six through-holes in total) may be provided in the arm 3 symmetrically in the right-and-left direction with respect to the center line O, so that three support pins 11, projectably provided on a table 13 of each process unit for delivering the wafer W, can pass through the associated three through-holes of each group. Thus, the arm 3 can be used for transferring the wafer among the process units.

In this embodiment, the two groups of three through-holes 12 are provided in the arm 3 symmetrically in the right-and-left direction with respect to the center line O for passing the two groups of three support pins 11. However, each group of three through-holes may be replaced with a single large hole through which the three pins 11 can pass.

In this embodiment, the other parts are the same as in the preceding embodiment. Therefore, the common parts are denoted by like reference numerals and a description thereof is omitted.

Third Embodiment

Figure 8:
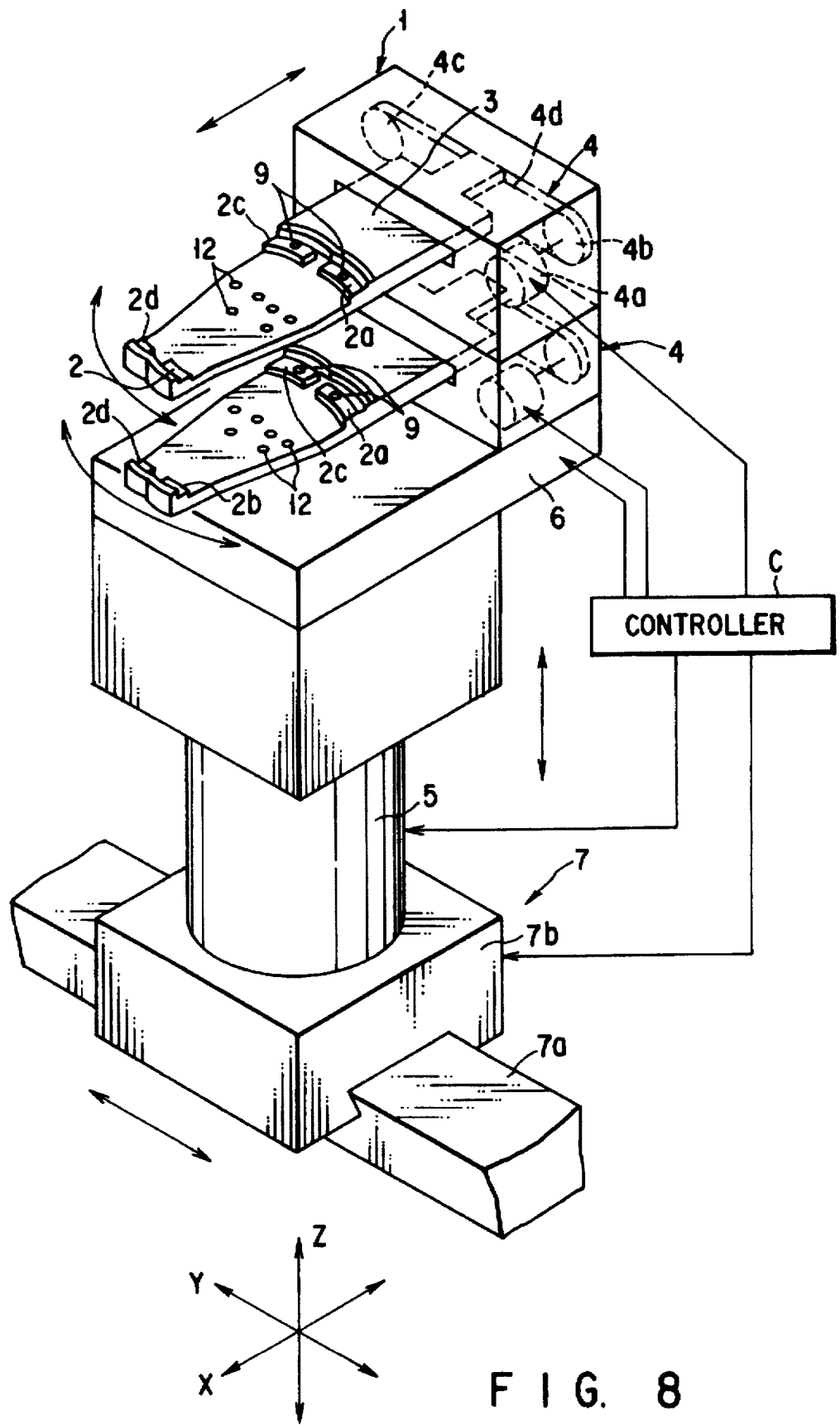
FIG. 8 is a perspective view showing a substrate transfer apparatus according to a third embodiment of the invention.

FIG. 8 is a perspective view showing a substrate transfer apparatus according to a third embodiment.

In the third embodiment, the number of support members for use in different transfer passages among the process units for wafers W is increased. Specifically, the arm 3 and position switching mechanisms 4, as shown in the first and second embodiments, are provided in multiple stages (two stages in the third embodiment), such that the arms 3 and position switching mechanisms 4 are rotatable in the horizontal (θ) direction. The arm 3 in each stage is provided with the first support portions 2a and 2b and second support portions 2c and 2d used for the respective transfer passages of wafers W.

In the third embodiment, like the second embodiment, the support portions 2a and 2c of the arm 3 are provided with suction hold small holes 9 as suction hold means. The holes 9 are connected to a vacuum pump 10a via passages 10 provided in the arm 3. In addition, through-holes 12 for passing support pins are formed in the arm 13 symmetrically in the right-and-left direction with respect to the center line O.

In the third embodiment, the other parts are the same as in the first and second embodiment. Therefore, the common parts are denoted by like reference numerals and a description thereof is omitted.

As has been described above, the arms 3 with plural support positions are provided in multiple stages for use in different transfer passages of wafers W. Thereby, a plurality of wafers W can be supported in different positions before and after the process. Therefore, a plurality of wafers W can be processed simultaneously and the efficiency of processing can be enhanced.

In the third embodiment, the arms 3 are provided in two stages by way of example. However, the arms 3 may be provided in three or more stages on an as-needed basis. In this embodiment, the arms of each stage are provided with suction hold small holes 9. However, there is no need to necessarily provide the arms 3 of each stage with the suction hold small holes 9 similarly. For example, the lower arm 3 alone may be provided with the small holes 9 while the upper arm 3 may be formed as in the first embodiment. Alternatively, the upper arm 3 alone may be provided with the small holes 9 while the lower arm 3 may be formed as in the first embodiment.

The substrate transfer apparatus of the present invention with the above structure can be used for transferring the wafer W between the carrier 8 of wafers W and one process unit. In addition, the substrate transfer apparatus may be built in a wafer coating/developing system.

A wafer coating/developing system 100 to which the substrate transfer apparatus of the present invention is applied will now be described.

Figure 9:
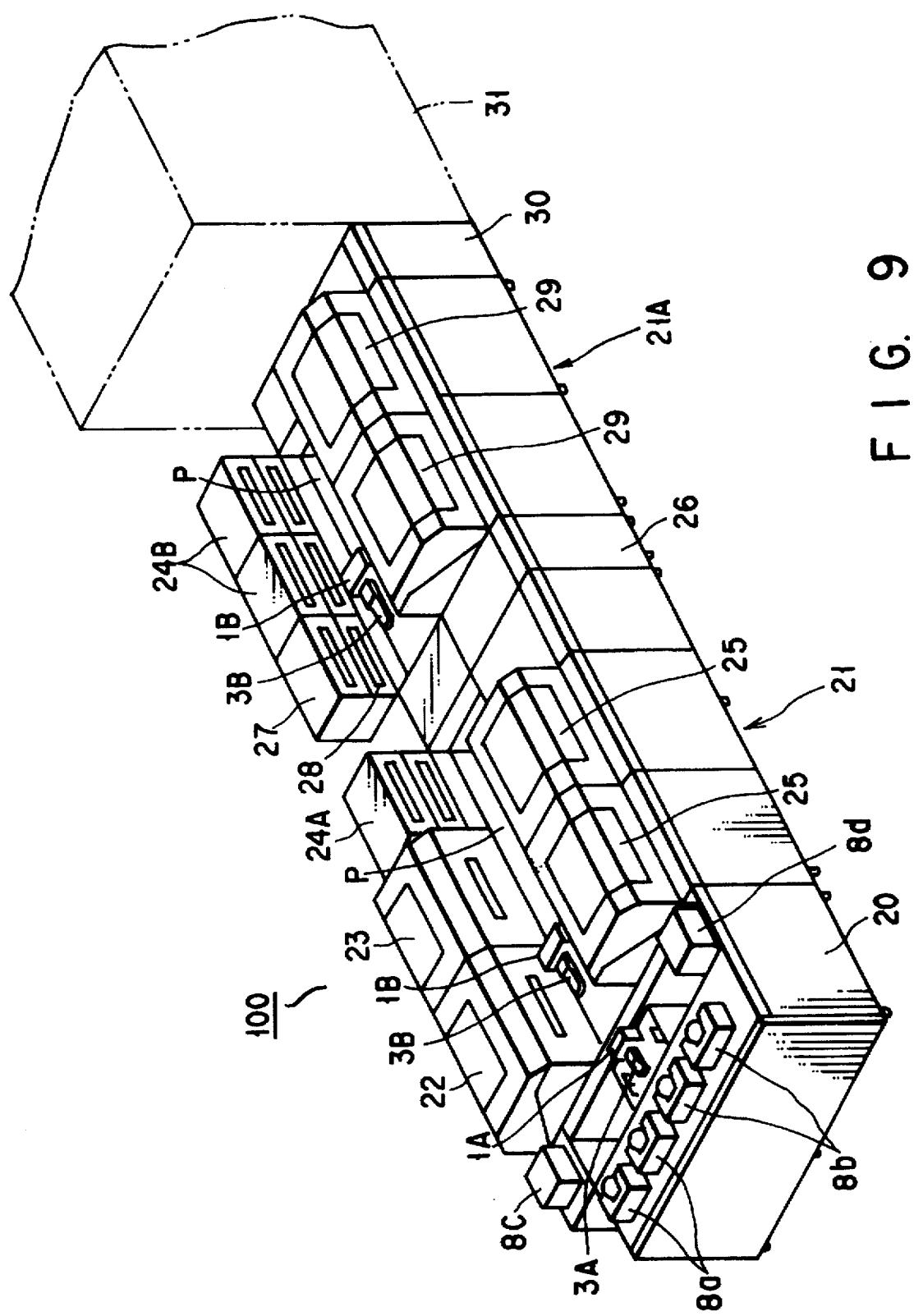
FIG. 9 is a perspective view showing a coating/developing system for semiconductor wafers, to which the substrate transfer apparatus of the present invention is applied.

As is shown in FIG. 9, the wafer coating/developing system 100 is provided at one end with a carrier station 20. The carrier station 20 includes two carriers 8a for storing substrates to be processed, for example, many non-processed wafers W and two carriers 8b for storing processed wafers W. The carriers 8a and 8b are juxtaposed. The carrier station 20 further includes a reject carrier 8c on one side (rear side) of the carriers 8a and 8b and a pickup carrier 8d on the other side (front side). The reject carrier 8c stores wafers W rejected in an exposure process due to trouble and the pickup carrier 8d stores wafers W for sampling. A first substrate transfer apparatus 1A having the same structure as the above-described substrate transfer apparatus 1 is provided at a central part of the carrier station 20 for receiving and delivering the wafers W and aligning the wafers W. The carriers 8a to 8d are situated on the same level, whereby the range of movement of arm 3A of the first substrate transfer apparatus 1A can be decreased to a minimum. In addition, the stroke in the vertical (Z) direction can be reduced and quick transfer of wafers W can be performed.

The coating/developing process system 100 is provided with a second substrate transfer apparatus 1B at a central portion of the system 100. The second substrate transfer apparatus 1B is movable in its longitudinal direction and includes arm 3B for receiving/delivering a wafer W from/to the arm 3A of the first substrate transfer apparatus 1A. Various process mechanisms are arranged on both sides of a transfer path P of the second substrate transfer apparatus. Vacuum suction small holes are formed in the arm 3B as substrate suction means. The arms 3A and 3B have the same basic structure as the arm 3. Either arms 3A or 3B have first support portions 2a and 2b and second support portions 2c and 2d.

Specifically, the process mechanisms include a process station 21 on the side of the carrier station 20. In the process station 21, a brush scrubber 22 for washing, for example, wafers W and a high-pressure jet washer 23 for washing wafers W with high-pressure jet water are juxtaposed. Two heating devices 24A are stacked, adjacent to the high-pressure jet washer 23. Two developing devices 25 are juxtaposed on the opposite side of the transfer path P of the second substrate transfer apparatus 1B.

The process mechanisms includes another process station 21A situated on the side of the process station 21 with a coupling unit 26 interposed therebetween. In the process station 21A, an adhesion process device 27 for subjecting, for example, the wafer W to a hydrophobic treatment before coating a resist thereon. A cleaning device 28 is situated under the adhesion process device 27. Four heating devices 24B are stacked in two rows and in two columns on the side of the devices 27 and 28.

Two resist coating devices 29 for coating resist liquid on the wafer W are arranged on that side of a transfer path of another second substrate transfer apparatus 1B, which are opposed to the heating devices 24B, adhesion process device 27, etc. Devices such as an exposing device 31 for forming a predetermined fine pattern on the resist film by exposure, etc. are arranged on the side of the resist coating devices 29 with an interface unit 30 interposed.

In the process system with the above structure, a wafer for sampling contained in the pickup carrier 8d is supported and conveyed by the first support portions 2a and 2b or the second support portions 2c and 2d of the arm 3A of the first substrate transfer apparatus 1A. After the wafer for sampling is transferred to the arm 3B of the second substrate transfer apparatus 1B, it is transferred to each process unit and an operation test of the process system is performed.

Subsequently, for example, one non-processed wafer W contained in the carrier 8a of the carrier station 20 is supported and conveyed by, for example, the first support portions 2a and 2b of the arm 3A of the first substrate transfer apparatus 1A. After the wafer W is transferred to the first support portions 2a and 2b of the arm 3B of the second substrate transfer apparatus 1B, the wafer W is transferred to the brush scrubber 22. After the wafer W is washed, the washed wafer W is received by, for example, the second support portions 2c and 2d of the arm 3B. In a similar manner, the wafer W is subjected to the adhesion process, cooled, and coated with a resist in the resist coating device 29. Then, a resist film portion on the peripheral edge of the wafer W is removed. Thereafter, the wafer W is subjected to a pre-baking process in which a solvent remaining in the resist is heated and evaporated, and then subjected to exposure in the exposing device 31. After the developing process, a post-baking process is performed, in which a developing liquid remaining in the developed photoresist is heated and evaporated. The processed wafer W is transferred from the second support portions 2c and 2d of the arm 3B of the second substrate transfer apparatus 1B to the second support portions 2c and 2d of the arm 3A of the first substrate transfer apparatus 1A. Then, the wafer W is conveyed and stored into the carrier 8b of the carrier station 20. Thus, a series of the resist coating/developing processes are completed.

If some trouble occurs in the exposure process, the wafer W involved in the trouble is shifted from the arm 3B of the second substrate transfer apparatus 1B to the arm 3A of the first substrate transfer apparatus 1A and is stored in the reject carrier 8c.

In each of the above embodiments, the substrate to be processed is the semiconductor wafer. Needless to say, the substrate transfer apparatus of this invention is applicable to substrates other than semiconductor wafers.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A substrate transfer apparatus for receiving and delivering a substrate among a plurality of process locations and transferring the substrate among the process locations, said apparatus comprising:
    an apparatus body;
    a transfer arm member for supporting and transferring the substrate, said transfer arm member having a first end which is supported by the apparatus body and a second end which is free, an a having supporting means capable of supporting said substrate at a plurality of different supporting positions on a same plane, wherein when said substrate is supported by one of said supporting means at one of said supporting positions, each remaining supporting means is out of contact with said substrate, and wherein said supporting positions are adjacent to each other, substrate regions of adjacent supporting positions partially overlap with each other, with each substrate region corresponding to a region occupied by a substrate disposed in one of said supporting positions, and said supporting means has a first and a second support portion for supporting said substrate at positions opposing each other of a circumferential portion of said substrate;
    moving means for moving the transfer arm member for enabling the transfer arm member to receive and deliver the substrate; and
    switching means for horizontally shifting the transfer arm member in said same plane, thereby moving the first support portion and the second support portion between said plurality of different supporting positions for receiving and delivering the substrate on said supporting means.

2. The substrate transfer apparatus according to claim 1, wherein said transfer arm member supports the substrate horizontally.

3. The substrate transfer apparatus according to claim 2, wherein said moving means includes an advancing/retreating mechanism for advancing/retreating the transfer arm member relative to the apparatus body, and a vertical movement mechanism for vertically moving the transfer arm member.

4. The substrate transfer apparatus according to claim 3, wherein said moving means further includes a rotational movement mechanism for rotating said transfer arm member.

5. A substrate transfer apparatus for receiving and delivering a substrate among a plurality of process locations and transferring the substrate among the process locations, said apparatus comprising:
    an apparatus body;
    a transfer arm member for supporting and transferring the substrate, said transfer arm member having a first end which is supported by the apparatus body and a second end which is free, and having supporting means capable of supporting said substrate at a plurality of different supporting positions on a same plane, wherein when said substrate is supported by one of said supporting means at one of said supporting positions, each remaining supporting means is out of contact with said substrate, and wherein said supporting positions are adjacent to each other, substrate regions of adjacent supporting positions partially overlap with each other, with each substrate region corresponding to a region occupied by a substrate disposed in one of said supporting positions, and said supporting means has a pair of support portions for supporting said substrate at positions opposing each other of a circumferential portion of said substrate;
    moving means for moving the transfer arm member for enabling the transfer arm member to receive and deliver the substrate;
    attracting mean for attracting the substrate to at least one of said support portion, whereby the substrate is held by the second end of the transfer arm member; and
    switching means for horizontally shifting the transfer arm member in said same plane, thereby moving the first support portion and the second support portion between said plurality of different supporting position for receiving and delivering the substrate on said supporting means.

6. The substrate transfer apparatus according to claim 5, wherein said attracting means includes a suction hole formed in each of said support portions, and a pump for evacuating through the suction hole.

7. The substrate transfer apparatus according to claim 5, wherein said transfer arm member supports the substrate horizontally.

8. The substrate transfer apparatus according to claim 7, wherein said moving means includes an advancing/retreating mechanism for advancing/retreating the transfer arm member relative to the apparatus body, and a vertical movement mechanism for vertically moving the transfer arm member.

9. The substrate transfer apparatus according to claim 8, wherein said moving means further includes a rotational movement mechanism for rotating said transfer arm member.

10. A substrate transfer apparatus for receiving and delivering a substrate among a plurality of process locations and transferring the substrate among the process locations, said apparatus comprising:
    an apparatus body;
    a plurality of transfer members, movably provided on the apparatus body, for supporting and transferring the substrate, each of said transfer members having a plurality of supporting means capable of supporting said substrate at a plurality of different supporting positions on a same plane, wherein when said substrate is supported by one of said supporting means at one of said supporting positions, each remaining supporting means is out of contact with said substrate, and wherein said supporting positions are adjacent to each other, and substrate regions of adjacent supporting positions partially overlap with each other, with each substrate region corresponding to a region occupied by a substrate disposed in one of said supporting positions;

moving means for moving each of said transfer members for enabling each of the transfer members to receive and deliver the substrate; and switching means for switching the position of each of said transfer members among a plurality of positions for receiving and delivering the substrate on said supporting means.

11. The substrate transfer apparatus according to claim 10, wherein each of said plurality of transfer members supports the substrate horizontally.

12. The substrate transfer apparatus according to claim 11, wherein said plurality of transfer members are situated to overlap one another vertically.

13. The substrate transfer apparatus according to claim 12, wherein said moving means includes an advancing/retreating mechanism for advancing/retreating each of said plurality of transfer members relative to the apparatus body, and a vertical movement mechanism for vertically moving each of said plurality of transfer members.

14. The substrate transfer apparatus according to claim 13, wherein said moving means further includes a rotational movement mechanism for rotating each of said plurality of transfer members.

15. The substrate transfer apparatus according to claim 10, wherein each of said supporting means has a pair of support portions for supporting said substrate at positions opposing each other of a circumferential portion of said substrate.

16. A substrate transfer apparatus for receiving and delivering a substrate among a plurality of process locations and transferring the substrate among the process locations, said apparatus comprising:

an apparatus body;

a transfer member, movably provided on the apparatus body, for supporting and transferring the substrate, said transfer member having a first pair of support portions and a second pair of support portions capable of supporting said substrate respectively at a first supporting position and a second supporting position, which are different from each other on a same plane, the first and second pairs of support portions each providing a support for opposing circumferential positions of said substrate, wherein when said substrate is situated on one of said first pair of support portions and said second pair of support portions, another of said first pair of support portions and said second pair of support portions is at a position out of contact with said substrate, and wherein substrate regions of the first and second supporting positions partially overlap with each other, with each substrate region respectively corresponding to a region occupied by a substrate disposed in said first and second supporting positions;

moving means for moving the transfer member for enabling the transfer member to receive and deliver the substrate; and switching means for switching the position of the transfer member among a plurality of positions for receiving and delivering the substrate on said support portions.

17. The substrate transfer apparatus according to claim 16, wherein said transfer member supports the substrate horizontally.

18. The substrate transfer apparatus according to claim 17, wherein said moving means includes an advancing/retreating mechanism for advancing/retreating the transfer member relative to the apparatus body, and a vertical movement mechanism for vertically moving the transfer member.

19. The substrate transfer apparatus according to claim 18, wherein said moving means further includes a rotational movement mechanism for rotating said transfer member.

20. The substrate transfer apparatus according to claim 5, wherein the second end of the transfer arm member has a plurality of holes and a plurality of rod members which are projectable from the holes to lift the substrate upwards from the first and second support portions.

* * * * *